(12) United States Patent
Weng et al.

(10) Patent No.: US 11,522,127 B2
(45) Date of Patent: *Dec. 6, 2022

(54) SEMICONDUCTOR DEVICE AND MANUFACTURING METHOD THEREOF

(71) Applicant: UNITED MICROELECTRONICS CORP., Hsin-Chu (TW)

(72) Inventors: Chen-Yi Weng, New Taipei (TW); Jing-Yin Jhang, Tainan (TW); Hui-Lin Wang, Taipei (TW); Chin-Yang Hsieh, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 29 days.

This patent is subject to a terminal disclaimer.

(21) Appl. No.: 17/204,937

(22) Filed: Mar. 18, 2021

(65) Prior Publication Data

US 2021/0202832 A1 Jul. 1, 2021

Related U.S. Application Data

(60) Continuation of application No. 16/885,233, filed on May 27, 2020, now Pat. No. 10,991,878, which is a (Continued)

(30) Foreign Application Priority Data

Nov. 5, 2018 (CN) .......................... 201811306131.7

(51) Int. Cl.
*H01L 27/22* (2006.01)
*H01L 43/12* (2006.01)
(Continued)

(52) U.S. Cl.
CPC ............ *H01L 43/12* (2013.01); *H01L 27/228* (2013.01); *H01L 43/02* (2013.01); *H01L 43/08* (2013.01); *H01L 43/10* (2013.01)

(58) Field of Classification Search
CPC ..... H01L 27/22; H01L 27/222; H01L 27/228; H01L 43/02; H01L 43/08; H01L 43/10; H01L 43/12
(Continued)

(56) References Cited

U.S. PATENT DOCUMENTS 6,946,698 B1 9/2005 Lin
10,707,412 B2 * 7/2020 Weng .................... H01L 27/222
(Continued)

OTHER PUBLICATIONS

Feng, the specification, including the claims, and drawings in the U.S. Appl. No. 16/056,551, filed Aug. 7, 2018.

*Primary Examiner* — Fazli Erdem
(74) *Attorney, Agent, or Firm* — Winston Hsu

(57) ABSTRACT

A manufacturing method of a semiconductor device includes the following steps. A first inter-metal dielectric (IMD) layer is formed on a substrate. A cap layer is formed on the first IMD layer. A connection structure is formed on the substrate and penetrates the cap layer and the first IMD layer. A magnetic tunnel junction (MTJ) stack is formed on the connection structure and the cap layer. A patterning process is performed to the MTJ stack for forming a MTJ structure on the connection structure and removing the cap layer. A spacer is formed on a sidewall of the MTJ structure and a sidewall of the connection structure. A second IMD layer is formed on the first IMD layer and surrounds the MTJ structure. The dielectric constant of the first IMD layer is lower than the dielectric constant of the second IMD layer.

6 Claims, 5 Drawing Sheets

Related U.S. Application Data division of application No. 16/208,566, filed on Dec. 4, 2018, now Pat. No. 10,707,412.

(51) Int. Cl.
  *H01L 43/10* (2006.01)
  *H01L 43/02* (2006.01)
  *H01L 43/08* (2006.01)

(58) Field of Classification Search
  USPC .......................................................... 257/421
  See application file for complete search history.

(56) References Cited

U.S. PATENT DOCUMENTS

| | | | |
|---|---|---|---|
| 2015/0171314 A1* | 6/2015 | Li | H01L 43/02 |
| | | | 257/421 |
| 2015/0249209 A1* | 9/2015 | Lu | H01L 43/02 |
| | | | 257/421 |
| 2016/0093668 A1 | 3/2016 | Lu | |
| 2017/0018704 A1 | 1/2017 | Chuang | |
| 2018/0350875 A1 | 12/2018 | Han | |
| 2019/0131518 A1* | 5/2019 | Yu | H01L 43/08 |
| 2019/0157139 A1* | 5/2019 | Cheng | H01L 23/5226 |
| 2020/0013949 A1* | 1/2020 | Feng | H01L 45/1666 |

* cited by examiner

SEMICONDUCTOR DEVICE AND MANUFACTURING METHOD THEREOF

CROSS REFERENCE TO RELATED APPLICATIONS

This application is a continuation of U.S. application Ser. No. 16/885,233 filed on May 27, 2020, now allowed, which is a division of application Ser. No. 16/208,566 filed on Dec. 4, 2018 and now U.S. Pat. No. 10,707,412, the disclosures of each being hereby incorporated by reference herein.

BACKGROUND OF THE INVENTION

1. Field of the Invention

The present invention relates to a semiconductor device and a manufacturing method thereof, and more particularly, to a semiconductor device including a magnetic tunnel junction (MTJ) structure and a manufacturing method thereof.

2. Description of the Prior Art

There are essentially two types of data memory devices used in electronic products, non-volatile and volatile memory devices. Magnetic random access memory (MRAM) is a kind of non-volatile memory technology. Unlike current industry-standard memory devices, MRAM uses magnetism instead of electrical charges to store data. In general, MRAM cells include a data layer and a reference layer. The data layer is composed of a magnetic material and the magnetization of the data layer can be switched between two opposing states by an applied magnetic field for storing binary information. The reference layer can be composed of a magnetic material in which the magnetization is pinned so that the strength of the magnetic field applied to the data layer and partially penetrating the reference layer is insufficient for switching the magnetization in the reference layer. During the read operation, the resistance of the MRAM cell is different when the magnetization alignments of the data layer and the reference layer are the same or not, and the magnetization polarity of the data layer can be identified accordingly.

The distance between adjacent MRAM cells is reduced as the density of the memory cell increases. Electrical problems, such as RC delay effect and crosstalk, may become more serious when the MRAM cells are disposed too close to one another, and the structure and/or the manufacturing process of the MRAM cell has to be improved accordingly.

SUMMARY OF THE INVENTION

A semiconductor device and a manufacturing method thereof are provided in the present invention. A cap layer is formed on a first inter-metal dielectric (IMD) layer, and the cap layer is removed in a patterning process of forming a magnetic tunnel junction (MTJ) structure. Therefore, a second IMD layer surrounding the MTJ structure may be formed on the first IMD layer for improving electrical interference between the MTJ structure and other conductive structures.

According to an embodiment of the present invention, a manufacturing method of a semiconductor device is provided. The manufacturing method includes the following steps. Firstly, a first inter-metal dielectric (IMD) layer is formed on a substrate. A cap layer is formed on the first IMD layer. A connection structure is formed on the substrate, and the connection structure penetrates the cap layer and the first IMD layer. A magnetic tunnel junction (MTJ) stack is formed on the connection structure and the cap layer. A patterning process is performed to the MTJ stack for forming a MTJ structure on the connection structure, and the cap layer is removed by the patterning process. A spacer is formed on a sidewall of the MTJ structure and a sidewall of the connection structure. A second IMD layer is formed on the first IMD layer, and the second IMD layer surrounds the MTJ structure.

According to an embodiment of the present invention, a semiconductor device is provided. The semiconductor device includes a substrate, a connection structure, a first inter-metal dielectric (IMD) layer, a magnetic tunnel junction (MTJ) structure, a spacer, and a second IMD layer. The connection structure is disposed on the substrate. The first IMD layer is disposed on the substrate and surrounds the connection structure. The MTJ structure is disposed on the connection structure. The spacer is disposes on a sidewall of the MTJ structure and a sidewall of the connection structure. The second IMD layer is disposed on the first IMD layer and surrounds the MTJ structure. A dielectric constant of the first IMD layer is lower than a dielectric constant of the second IMD layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a manufacturing method of a semiconductor device according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

DETAILED DESCRIPTION

Figure 1:
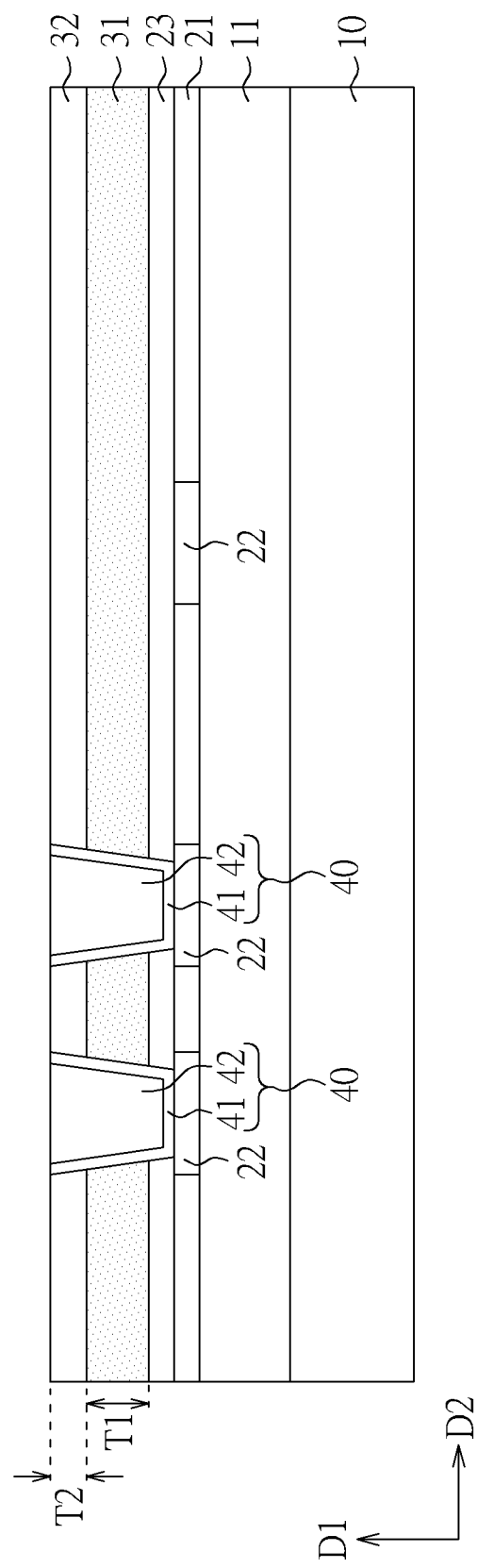
Figure 2:
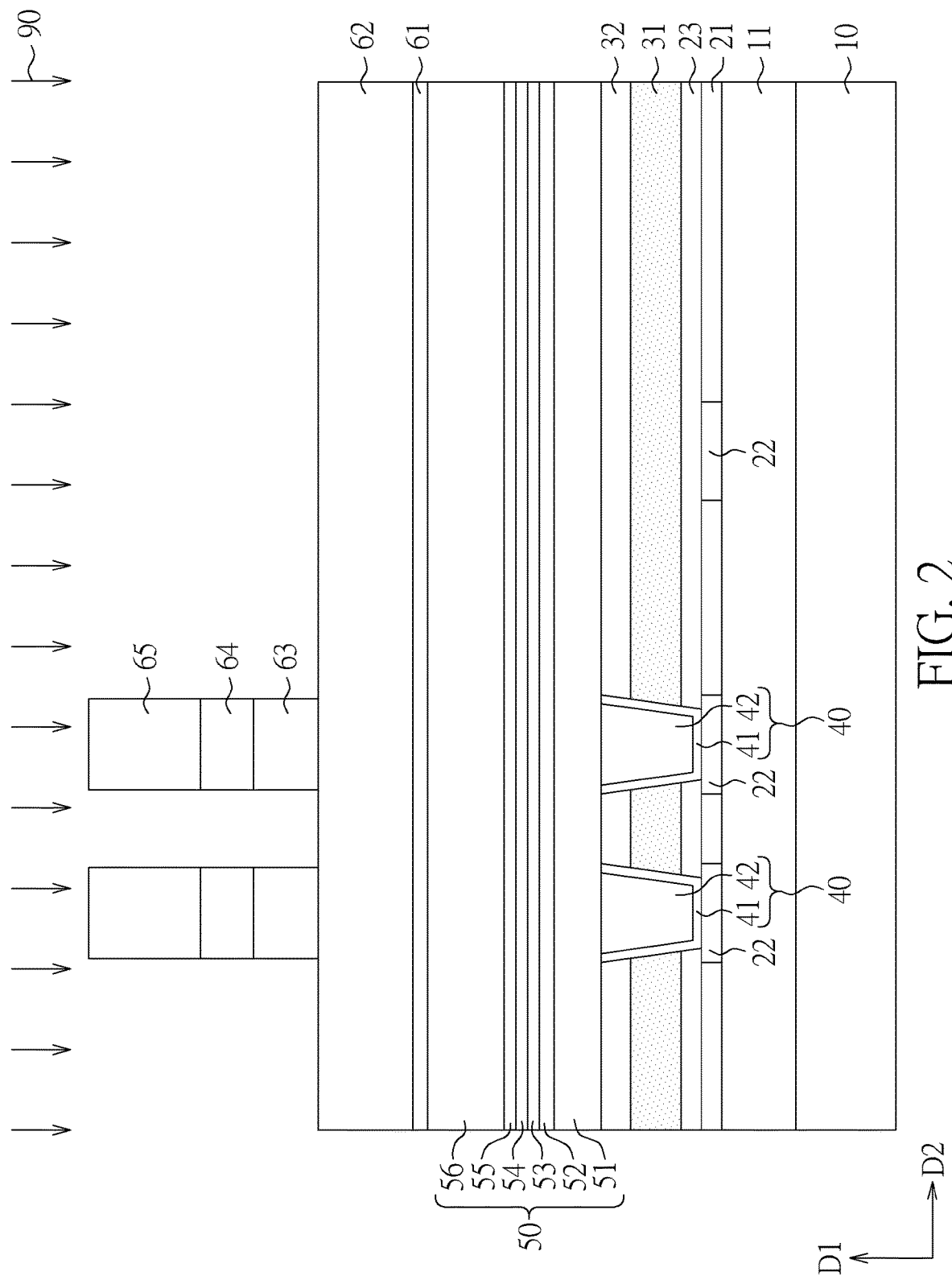
Figure 3:
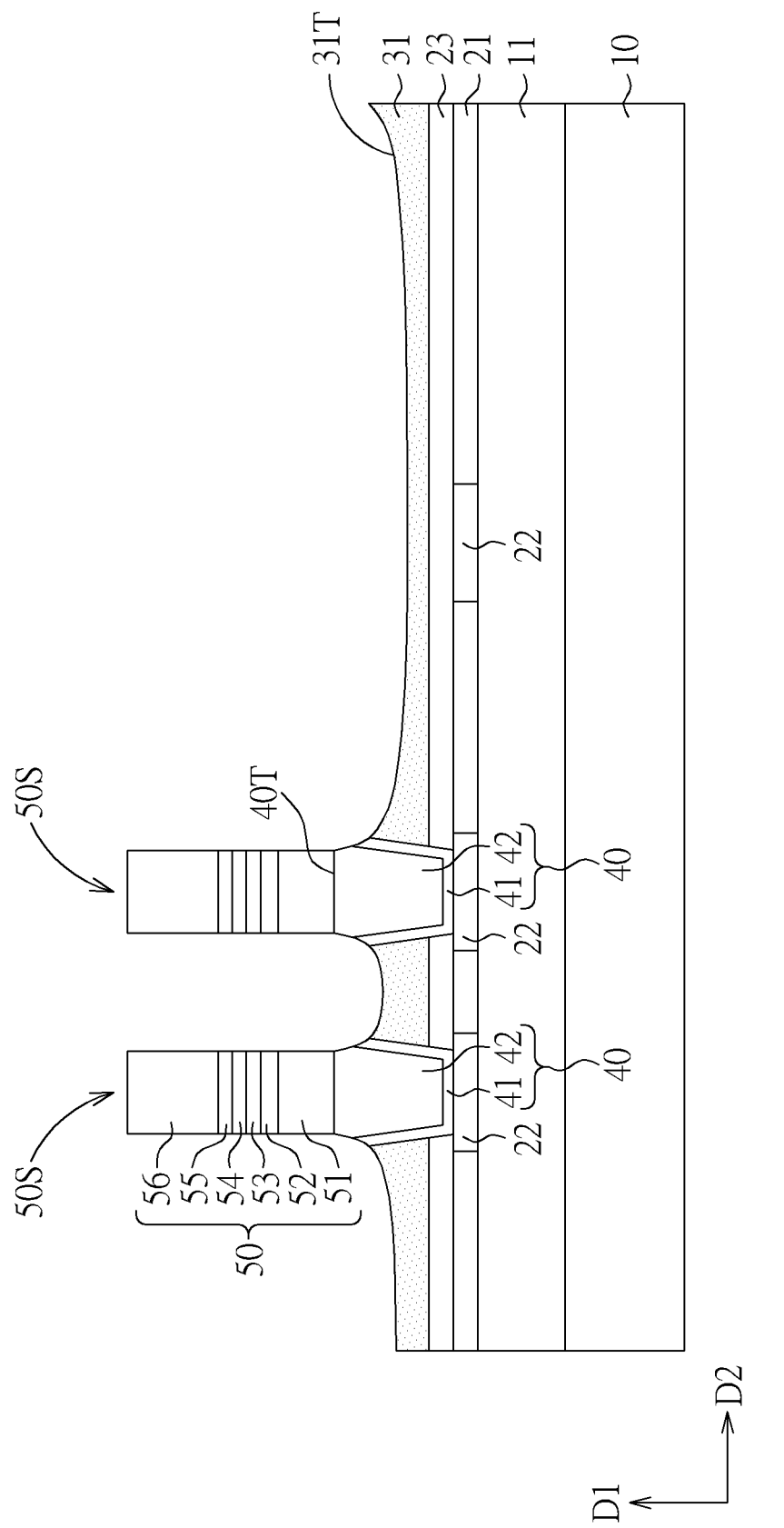
Figure 4:
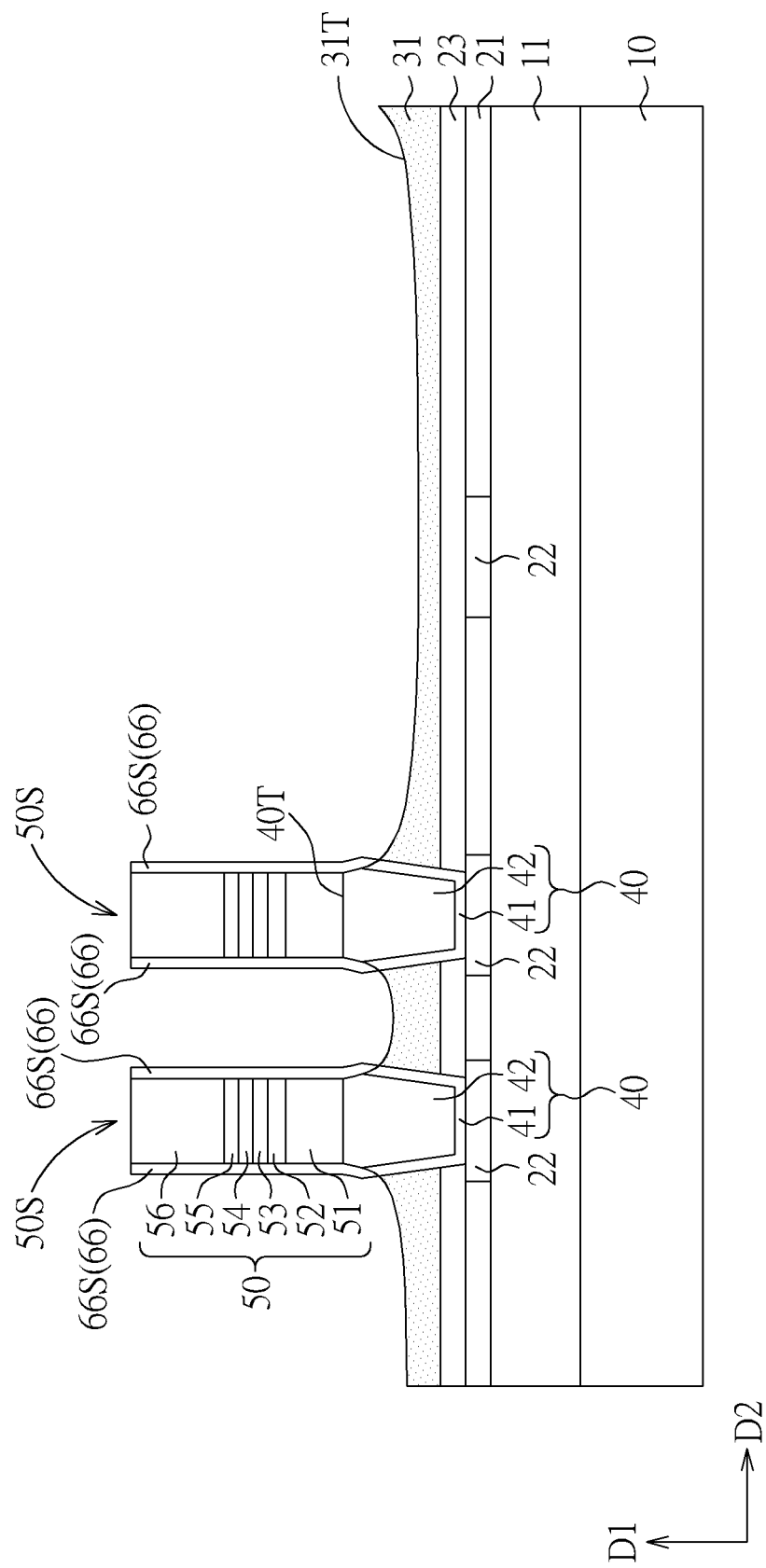
Figure 5:
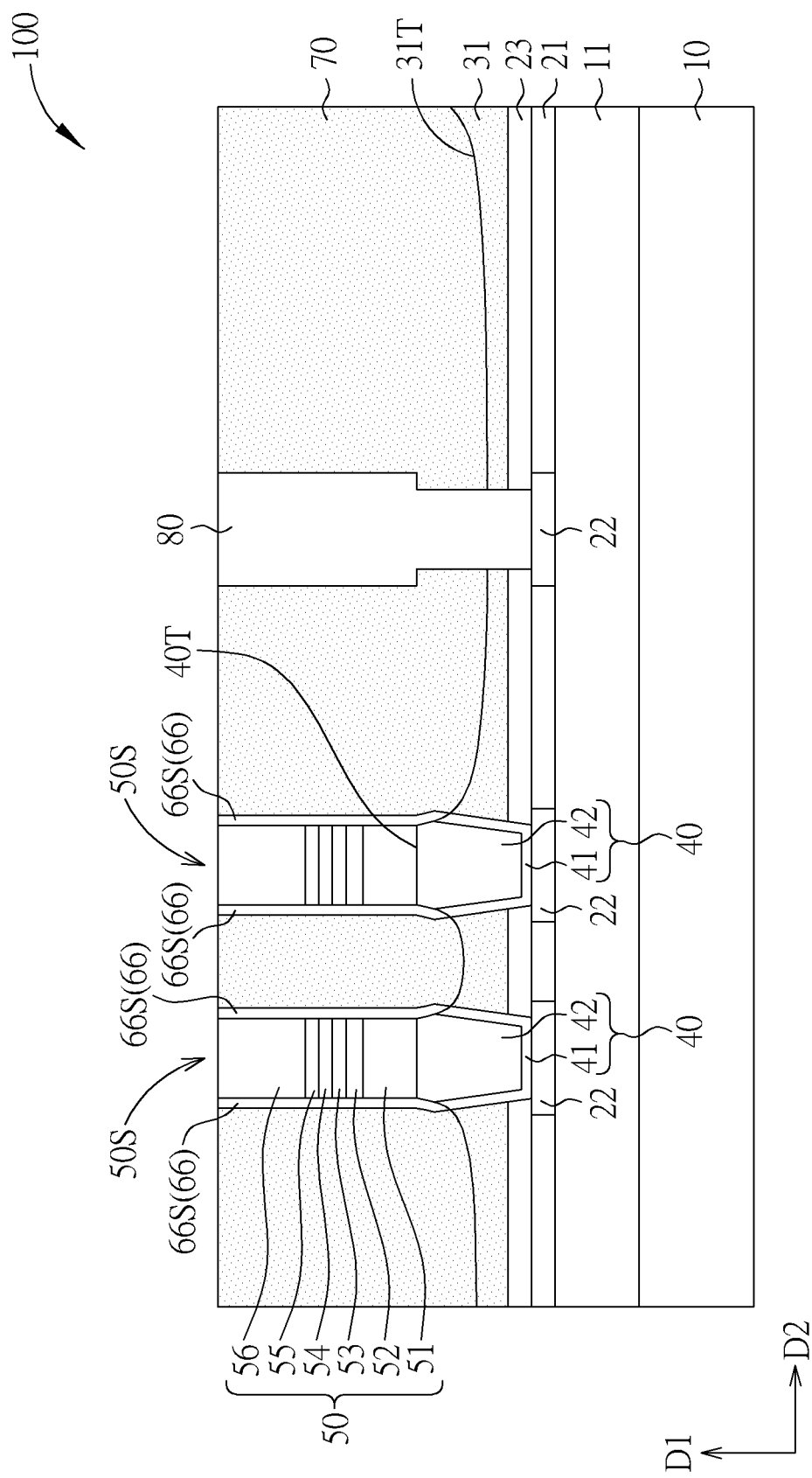

Please refer to FIGS. 1-5. FIGS. 1-5 are schematic drawings illustrating a manufacturing method of a semiconductor device according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4. The manufacturing method of the semiconductor device in this embodiment may include the following steps. Firstly, a first inter-metal dielectric (IMD) layer 31 is formed on a substrate 10. A cap layer 32 is formed on the first IMD layer 31. A connection structure 40 is then formed on the substrate 10, and the connection structure 40 may penetrate the cap layer 32 and the first IMD layer 31 in a thickness direction of the substrate 10 (such as a first direction D1 shown in FIG. 1). In some embodiments, a magnetic tunnel junction (MTJ) region and a logic region may be defined on the substrate 10, the first IMD layer 31 and the cap layer 32 may be formed both on the MTJ region and the logic region, and the connection structure 40 may be formed on the MTJ region, but not limited thereto.

In some embodiments, the first IMD layer 31 may include a low dielectric constant (low-k) dielectric material and/or an ultra low dielectric constant (ULK) dielectric material, such as benzocyciclobutene (BCB), hydrogen silsesquioxane (HSQ), methyl silesquioxane (MSQ), hydrogenated silicon oxycarbide (SiOC—H), and/or porous dielectric materials. A dielectric constant of the first IMD layer 31 may be lower than 2.9 (such as a general criterion for low-k dielectric materials), and the dielectric constant of the first IMD layer 31 may be lower than 2.7 (such as a general criterion for ULK dielectric materials) preferably, but not limited thereto. Additionally, the hardness of a low-k dielectric material (such as a porous structure applied to lower the dielectric constant) is relatively lower normally. Therefore, for avoiding influencing the manufacturing yield of the connection structure, a material having relatively higher dielectric constant and higher hardness is used to form the cap layer 32 preferably for avoiding the inability to form the desired shape of the connection structure 40. In some embodiments, the cap layer 32 may include silicon oxide, tetraethoxysilane (TEOS) oxide, or other suitable dielectric materials, but not limited thereto. Accordingly, the cap layer 32 may be a dielectric cap layer, the hardness of the cap layer 32 may be higher than the hardness of the first IMD layer 31, and the dielectric constant of the first IMD layer 31 may be lower than the dielectric constant of the cap layer 32. However, in some embodiments, the cap layer 32 may include other dielectric materials or conductive materials having higher etching selectivity with the material of the connection structure 40 according to some considerations.

In some embodiments, the substrate 10 may include a semiconductor substrate or a non-semiconductor substrate. The semiconductor substrate may include a silicon substrate, a silicon germanium semiconductor substrate or a silicon-on-insulator (SOI) substrate, and the non-semiconductor substrate may include a glass substrate, a plastic substrate, or a ceramic substrate, but not limited thereto. For example, when the substrate 10 includes a semiconductor substrate, a plurality of silicon-based field effect transistors (not shown), a dielectric layer (such as a first dielectric layer 11 and a second dielectric layer 21 shown in FIG. 1) covering the silicon-based field effect transistors, and an interconnection structure 22 may be formed on the semiconductor substrate before the step of forming the first IMD layer 31. The first dielectric layer 11 and the second dielectric layer 21 may include silicon oxide, low-k dielectric materials, or other suitable dielectric materials. In some embodiments, the connection structure 40 may be electrically connected with a part of the interconnection structure 22, and the connection structure 40 may be electrically connected downward to the silicon-based field effect transistor described above via a part of the interconnection structure 22, but not limited thereto. In some embodiments, the interconnection structure 22 may include a trench conductor, and the connection structure 40 may include a via conductor. Additionally, the interconnection structure 22 and the connection structure 40 may be formed by a barrier layer and a metal layer, and the interconnection structure 40 may include a barrier layer 41 and a metal layer 42 for example, but not limited thereto. The barrier layer 41 may include titanium (Ti), titanium nitride (TiN), tantalum (Ta), tantalum nitride (TaN), or other suitable barrier materials. The metal layer 42 may include tungsten (W), copper (Cu), aluminum (Al), titanium aluminide (TiAl), cobalt tungsten phosphide (CoWP), or other suitable metallic materials.

In some embodiments, a stop layer 23 may be formed on the substrate 10 before the step of forming the first IMD layer 31. The stop layer 23 may cover the second dielectric layer 21 and the interconnection structure 22. The first IMD layer 31 may be formed on the stop layer 23, and the connection structure 40 may further penetrate the stop layer 23 for contacting and being electrically connected to the interconnection structure 22. The stop layer 23 may include nitrogen doped carbide (NDC), silicon nitride, silicon carbonitride (SiCN), or other suitable insulation materials. In some embodiments, the stop layer 23 may be an insulation material having relatively higher hardness, and the dielectric constant of the first IMD layer 31 may be lower than the dielectric constant of the stop layer 23, but not limited thereto. Additionally, it is worth noting that because the cap layer 32 is going to be removed in the subsequent process, the thickness of the cap layer 32 (such as a second thickness T2 shown in FIG. 1) cannot be too large for avoiding the influence of the residue of the cap layer 32 on the effective dielectric constant of the total dielectric material. However, the cap layer 32 with a specific thickness is still required for providing a supporting effect in the step of forming the connection structure 40. Therefore, in some embodiments, the thickness of the first IMD layer 31 (such as a first thickness T1 shown in FIG. 1) may be larger than or equal to the second thickness T2 of the cap layer 32, but not limited thereto.

Subsequently, as shown in FIG. 2 and FIG. 3, a magnetic tunnel junction (MTJ) stack 50 may be formed on the connection structure 40 and the cap layer 32. A patterning process 90 may be performed to the MTJ stack 50 for forming a MTJ structure 50S on the connection structure 40. In some embodiments, the MTJ stack 50 may include a first conductive layer 51, a pinned layer 52, a first barrier layer 53, a free layer 54, a second barrier layer 55, and a second conductive layer 56 disposed sequentially stacked in the first direction D1, but not limited thereto. In some embodiments, the MTJ stack 50 may include a stacked structure different from the materials layers described above and/or include other material layers. In some embodiments, the first conductive layer 51 and the second conductive layer 56 may include metallic materials, such as tantalum (Ta), platinum (Pt), ruthenium (Ru), a stack layer of the above-mentioned materials, an alloy of the above-mentioned materials, or other suitable conductive materials. The pinned layer 52 may include an antiferromagnetic layer and a reference layer. The antiferromagnetic layer may include antiferromagnetic materials such as iron manganese (FeMn), platinum manganese (PtMn), iridium manganese (IrMn), nickel oxide (NiO), a cobalt/platinum (Co/Pt) multilayer, or other suitable antiferromagnetic materials. The free layer 54 and the reference layer in the pinned layer 52 may include ferromagnetic materials such as iron, cobalt, nickel, cobalt-iron (CoFe), cobalt-iron-boron (CoFeB), or other suitable ferromagnetic materials. The first barrier layer 53 and the second barrier layer 55 may include insulation materials such as magnesium oxide (MgO), aluminum oxide, or other suitable insulation materials. The above-mentioned material layers in the MTJ stack 50 may be formed by deposition processes, such as sputtering processes, but not limited thereto.

In some embodiments, the patterning process 90 may include forming a first mask layer 61, a second mask layer 62, an organic dielectric layer 63, an anti-reflection layer 64, and a patterned photoresist layer 65 sequentially on the MTJ stack 50. The material of the first mask layer 61 may be different from the material of the second mask layer 62 preferably. For example, the first mask layer 61 may include silicon nitride and the second mask layer 62 may include silicon oxide, but not limited thereto. The organic dielectric layer 63 may include an organic distribution layer (ODL) or other suitable organic dielectric materials. The anti-reflection layer 64 may include a silicon-containing hard mask bottom anti-reflecting coating (SHB) or other suitable anti-reflecting materials. Subsequently, one or more etching steps may be used to remove a part of the first mask layer 61, a part of the second mask layer 62, a part of the MTJ stack 50, the cap layer 32, and a part of the first IMD layer 31 for forming the MTJ structure 50S on the connection structure 40.

It is worth noting that the cap layer 32 may be removed by the etching step of the patterning process 90 concurrently. For example, in some embodiments, the patterning process 90 may include a reactive ion etching (RIE) process and an ion beam etching (IBE) process. The ME process may be used to etch the first mask layer 61, the second mask layer 62, and a part of the MTJ stack 50. The IBE process may be performed after the RIE process, and the second mask layer 62 may be used as a mask in the IBE process for forming the MTJ structure 50S. The cap layer 32 and a part of the first IMD layer 31 may be removed by the IBE process of the patterning process 90, but not limited thereto. Due to the characteristics of the IBE process, the top surface of the remaining first IMD layer 31 (such as a first top surface 31T shown in FIG. 3) may include a concave surface, such as a curve surface pointing downwards, after the patterning process 90, and the first top surface 31T of the first IMD layer 31 may be lower than a top surface of the connection structure 40 (such as a second top surface 40T shown in FIG. 3) in the thickness direction of the substrate 10 (such as the first direction D1) after the patterning process 90. Additionally, in some embodiments, the cap layer 32 may be removed completely by the patterning process 90 preferably for avoiding the cap layer 32 remaining on the first IMD layer 31 after the patterning process 90, the influence of the remaining cap layer 32 on the isolation performance of the dielectric materials between the adjacent MTJ structures 50S and between the adjacent connection structures 40 in a horizontal direction (such as a second direction D2 parallel to a surface of the substrate 10 shown in FIG. 3), and/or the influence of the remaining cap layer 32 on the isolation performance of the dielectric materials between the MTJ structure 50S and other conductive structures subsequently formed in the second direction D2 and the dielectric materials between the connection structure 40 and other conductive structures subsequently formed in the second direction D2.

As shown in FIG. 4 and FIG. 5, a second IMD layer 70 is then formed on the first IMD layer 31, and the second IMD layer 70 may surround the MTJ structure 50S in a horizontal direction (such as the second direction D2). In some embodiments, a spacer 66S may be formed on a sidewall of the MTJ structure 50S before the step of forming the second IMD layer 70. The method of forming the spacer 66S may include but is not limited to the following steps. A spacer material layer 66 may be formed conformally on the MTJ stack 50S, the connection structure 40, and the first IMD layer 31. An etching process may then be performed to the spacer material layer 66 for removing a part of the spacer material layer 66 (such as the spacer material layer 66 on the first IMD layer 66), and the spacer material layer 66 remaining on the sidewall of the MTJ structure 50S becomes the spacer 66S. The spacer material layer 66 may include silicon oxide, silicon oxynitride, silicon carbonitride, aluminum oxide, or other insulation materials with a protection effect better than that of the second IMD layer 70. Additionally, in some embodiments, an upper portion of the connection structure 40 may be etched by the patterning process of forming the MTJ structure 50 described above and has a sidewall without being covered by the first IMD layer 31. The space 66S may further cover the sidewall of the upper portion of the connection structure 40 for providing a protection effect especially when the metal layer 42 in the connection structure 40 is exposed directly by the sidewall.

In some embodiments, the second IMD layer 70 may include a low-k dielectric material and/or an ULK dielectric material, such as BCB, HS, MSQ, hydrogenated silicon oxycarbide, and/or porous dielectric materials. A dielectric constant of the second IMD layer 70 may be lower than 2.9, and the dielectric constant of the second IMD layer 70 may be lower than 2.7 preferably, but not limited thereto. The dielectric constant of the second IMD layer 70 may be lower than a dielectric constant of the spacer 66S and the dielectric constant of the cap layer 32 shown in FIG. 2 because the spacer 66S may be formed by a material with better performance of blocking external materials from entering the MTJ structure 50S preferably, and the low dielectric constant of the second IMD layer 70 is mainly used to improve the electrical interference between the MTJ structures 50S and/or between the MTJ structure 50 and other conductive structures.

As shown in FIG. 2, FIG. 3, and FIG. 5, in some embodiments, the cap layer is completely removed by the patterning process 90, the second IMD layer 70 may directly contact the first IMD layer 31 accordingly, and the second IMD layer 70 may completely cover the first top surface 31T of the first IMD layer 31, but not limited thereto. Additionally, in some embodiments, the material composition of the first IMD layer 31 may be identical to the material composition of the second IMD layer 70, but not limited thereto. In some embodiments, the material composition of the first IMD layer 31 may be different from the material composition of the second IMD layer 70. For example, in some embodiments, a planarization process, such as a chemical mechanical polishing (CMP) process, may be performed after the step of forming the second IMD layer 70 for removing the second IMD layer 70 above the MTJ structure 50S, and a top surface of the second IMD layer 70 may be substantially flush with a top surface of the MTJ structure 50S accordingly. A patterning process may be performed subsequently for forming a contact hole penetrating the second IMD layer 70, the first IMD layer 31, and the stop layer 23 and exposing a part of the interconnection structure 22 which is not disposed corresponding to the connection structure 40 (such as the interconnection structure 22 on the logic region), and a contact plug 80 may be formed in the contact hole. The contact plug 80 may include a barrier material, such as titanium, titanium nitride, tantalum, or tantalum nitride, and a low resistivity material, such as tungsten, copper, aluminum, titanium aluminide, or cobalt tungsten phosphide. Therefore, the second IMD layer 70 located at the relatively upper portion may have higher hardness preferably for avoiding the inability to form the desired shape of the contact hole corresponding to the contact plug 80 and the influence on the manufacturing yield in the process of forming the contact plug 80, and the material composition of the second IMD layer 70 may be different from the material composition of the first IMD layer 31 accordingly. For example, in some embodiments, the dielectric constant of the first IMD layer 31 may be lower than the dielectric constant of the second IMD layer 70, and the hardness of the second IMD layer 70 may be higher than the hardness of the first IMD layer 31.

A semiconductor device 100 shown in FIG. 5 may be obtained by the manufacturing method described above. As shown in FIG. 5, the semiconductor device 100 may include the substrate 10, the connection structure 40, the first IMD layer 31, the MTJ structure 50S, and the second IMD layer 70. The connection structure 40 is disposed on the substrate 10. The first IMD layer 31 is disposed on the substrate 10 and surrounds the connection structure 40. The MTJ structure 50S is disposed on the connection structure 40. The second IMD layer 70 is disposed on the first IMD layer 31 and surrounds the MTJ structure 50S. In some embodiments, the semiconductor device 100 may be regarded as a magnetoresistive random access memory (MRAM) device, but not limited thereto. Additionally, in some embodiments, the semiconductor device 100 may further include the contact plug 80 penetrating the second IMD layer 70, the first IMD layer 31, and the stop layer 23 in the first direction D1. By disposing the first IMD layer 31 and the second IMD layer 70 having low dielectric constant between the adjacent connection structures 40, between the adjacent MTJ structures 50S, between the contact plug 80 and the connection structure 40, and between the contact plug 80 and the MTJ structure 50S, the electrical interference between the adjacent MTJ structures 50 and/or between the MTJ structure 50S and the contact plug 80 may be reduced, and the operation performance of the semiconductor device 100 may be enhanced accordingly.

To summarize the above descriptions, in the semiconductor device and the manufacturing method thereof according to the present invention, the cap layer is formed on the first IMD layer, and the cap layer is removed in the patterning process of forming the MTJ structure. The second IMD layer surrounding the MTJ structure may be formed on the first IMD layer accordingly. The electrical interference between the MTJ structures and/or between the MTJ structure and other conductive structures may be improved by the first IMD layer and the second IMD layer having low dielectric constant, and the operation performance of the semiconductor device may be enhanced accordingly. Additionally, in some embodiments, the dielectric constant of the first IMD layer may be lower than the dielectric constant of the second IMD layer, and the hardness of the second IMD layer may be higher than the hardness of the first IMD layer for improving the related manufacturing yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a connection structure disposed on the substrate;
   a first inter-metal dielectric (IMD) layer disposed on the substrate and surrounding the connection structure;
   a magnetic tunnel junction (MTJ) structure disposed on the connection structure;
   a spacer disposes on a sidewall of the MTJ structure and a sidewall of the connection structure; and
   a second IMD layer disposed on the first IMD layer and surrounding the MTJ structure, wherein a dielectric constant of the first IMD layer is lower than a dielectric constant of the second IMD layer, and the second IMD layer directly contacts the first IMD layer.

2. The semiconductor device according to claim 1, wherein the dielectric constant of the first IMD layer and the dielectric constant of the second IMD layer are lower than 2.9.

3. The semiconductor device according to claim 1, wherein a hardness of the second IMD layer is higher than a hardness of the first IMD layer.

4. The semiconductor device according to claim 1, wherein a top surface of the first IMD layer comprises a concave surface, and the second IMD layer completely covers the top surface of the first IMD layer.

5. The semiconductor device according to claim 1, wherein a top surface of the first IMD layer is lower than a top surface of the connection structure in a thickness direction of the substrate.

6. The semiconductor device according to claim 1, wherein a dielectric constant of the second IMD layer is lower than a dielectric constant of the spacer.

* * * * *